US00RE41189E

(19) United States
(12) Reissued Patent
Li et al.

(10) Patent Number: US RE41,189 E
(45) **Date of Reissued Patent: *Apr. 6, 2010**

(54) METHOD OF MAKING ENHANCED CVD DIAMOND

(75) Inventors: Wei Li, Ann Arbor, MI (US); Russell J. Hemley, Washington, DC (US); Ho-kwang Mao, Washington, DC (US); Chih-shiue Yan, Washington, DC (US)

(73) Assignee: Carnegie Institution of Washington, Washington, DC (US)

( * ) Notice: This patent is subject to a terminal disclaimer.

(21) Appl. No.: 12/362,529

(22) Filed: Jan. 30, 2009

Related U.S. Patent Documents

Reissue of:
(64) Patent No.: 6,811,610
Issued: Nov. 2, 2004
Appl. No.: 10/161,266
Filed: Jun. 3, 2002

(51) Int. Cl.
*C23C 16/27* (2006.01)

(52) U.S. Cl. ..... 117/88; 427/249.7; 427/249.8; 427/370; 427/372.2; 427/444; 427/902

(58) Field of Classification Search ..... 427/249.7, 427/249.8, 370, 372.2, 444, 902; 117/88
See application file for complete search history.

(56) References Cited

U.S. PATENT DOCUMENTS

| | | | | | |
|---|---|---|---|---|---|
| 3,083,080 | A | * | 3/1963 | Bovenkerk | 423/446 |
| 3,134,738 | A | * | 5/1964 | Wood et al. | 510/280 |
| 3,141,748 | A | * | 7/1964 | Hoke et al. | 95/99 |
| 3,297,407 | A | * | 1/1967 | Wentor, Jr. | 423/446 |
| 3,423,177 | A | * | 1/1969 | Bovenkerk | 423/446 |
| 3,674,580 | A | * | 7/1972 | Stromberg et al. | 438/694 |
| 3,745,623 | A | * | 7/1973 | Wentorf et al. | 407/119 |
| 3,913,280 | A | * | 10/1975 | Hall | 51/307 |
| 4,073,380 | A | * | 2/1978 | Strong et al. | 206/219 |
| 4,124,690 | A | * | 11/1978 | Strong et al. | 423/446 |
| 5,011,509 | A | * | 4/1991 | Frushour | 51/293 |
| 5,264,283 | A | * | 11/1993 | Waldenstrom et al. | 428/408 |
| 5,672,395 | A | * | 9/1997 | Anthony et al. | 427/444 |
| 6,692,714 | B2 | * | 2/2004 | Vagarali et al. | 423/264 |

FOREIGN PATENT DOCUMENTS

| | | | |
|---|---|---|---|
| EP | 0 480 895 | * | 4/1992 |
| EP | 0480895 | * | 4/1992 |
| EP | 0 616 954 | * | 8/1994 |
| EP | 0616954 | * | 8/1994 |
| EP | 0 671 482 | * | 9/1995 |
| EP | 0671482 | * | 9/1995 |
| US | 2001/0031237 | * | 10/2001 |
| WO | WO 04/022821 | * | 3/2004 |

OTHER PUBLICATIONS

A.V. Khomich et al, Effect of High Temperature Annealing on Optical and Thermal Properties of CVD Diamond, 2001 Elsevier Science B.V. pp. 546–551.*

About CVD Diamond: Manufacture–Afford Industrial Diamond, PI Diamond Inc., Website printout of Apr. 30, 2002.*

CVD Diamond–a new Technology for the Future, Paul W. May, School of Chemistry, University of Briston, download from CVD Diamond Review–Endeavor Magazine, Apr. 29, 2002.*

* cited by examiner

*Primary Examiner*—Timothy H Meeks
*Assistant Examiner*—Elizabeth Burkhart
(74) *Attorney, Agent, or Firm*—Morgan Lewis & Bockius LLP

(57) ABSTRACT

Single crystal CVD diamond is heated to temperatures of 1500° C. to 2900° C. under a pressure that prevents significant graphitization. The result is a CVD diamond with improved optical properties.

7 Claims, 1 Drawing Sheet

METHOD OF MAKING ENHANCED CVD DIAMOND

Matter enclosed in heavy brackets [ ] appears in the original patent but forms no part of this reissue specification; matter printed in italics indicates the additions made by reissue.

BACKGROUND

This invention relates to a method of improving the optical, electrical, thermal, and mechanical properties of chemical vapor deposition (CVD) diamond. CVD diamond can be classified as either single crystal or polycrystalline. Either type can be manufactured to produce materials that range from opaque to fully transparent. Typical impurities within CVD diamond are graphite and hydrogen, although trace amounts of other materials may be present, such as nitrogen. In addition to impurities, there are structural defects which occur that further degrade the material and its properties as compared to a defect free natural diamond. As a result, CVD diamond is often opaque or very dark Most industrial applications for diamond require high quality crystals or films. Common applications include lenses that require high optical transmission of light, heat sinks that require very high heat conductivity, and electrical insulators. Prior work to improve these materials by high temperature treatment has shown that heating above 850° C. significantly degrades the sample. In fact, temperatures above 1600° C. have totally destroyed sample integrity due to formation of cracks thought to be the result of loss of bonded hydrogen or conversion of the diamond carbon to graphite.

Natural or synthetic diamond, on the other hand, can withstand treatment to very high temperatures. In fact, it has been shown that annealing of synthetic and natural type I or type II diamonds in the range of 1900° C. to 2600° C. at pressures in the range of 50 to 80 kbars causes the visible color of the diamond to change. In the case of natural diamond type I, the color changes from brown to yellow or yellow-green. For type II natural diamond, the color changes from brown to colorless or, on rare occasions, blue or pink. Synthetic diamond will change from yellow to lighter yellow.

It would be advantageous if a method were devised that would significantly improve the properties of CVD diamond after it is grown. It would also be desirable to form CVD diamond with fewer defects that serve to degrade the intrinsic properties of a perfect crystalline diamond material in order to enhance its usage in many applications.

SUMMARY

According to the present invention, there is provided a method of improving the optical properties of CVD diamond, which includes the steps of:

1. creating a reaction mass by placing the CVD diamond in a pressure transmitting medium that completely encloses the diamond; and 2. subjecting the reaction mass to a temperature of at least 1500° C. and, preferably, in the range of about 1800° C. to about 2900° C. under a pressure of at least 4.0 GPA.

The period of time during which the sample is subjected to HPHT conditions is from less than about one minute to about 30 minutes. The preferred time is between one to five minutes. The actual conditions can be varied depending on the grade and the size of the CVD sample.

The reaction mass may be subjected to any number of such treatments. Thus, if the desired results were not achieved the first time, the sample may be re-treated at HPHT until such time that the desired improvement in characteristics or properties is achieved.

The greatest improvements will be noted for single crystal CVD diamond that is void of defects, such as surface pits, microscopic inclusions, and that is at least partially translucent. Such CVD material may be so improved as to even be polished and faceted to produce a gem quality diamond to be used in jewelry.

BRIEF DESCRIPTION OF THE DRAWING

The various features, advantages and other uses of the present invention will be come more apparent by referring to the following detailed description and drawing in which.

DETAILED DESCRIPTION

Figure 1:
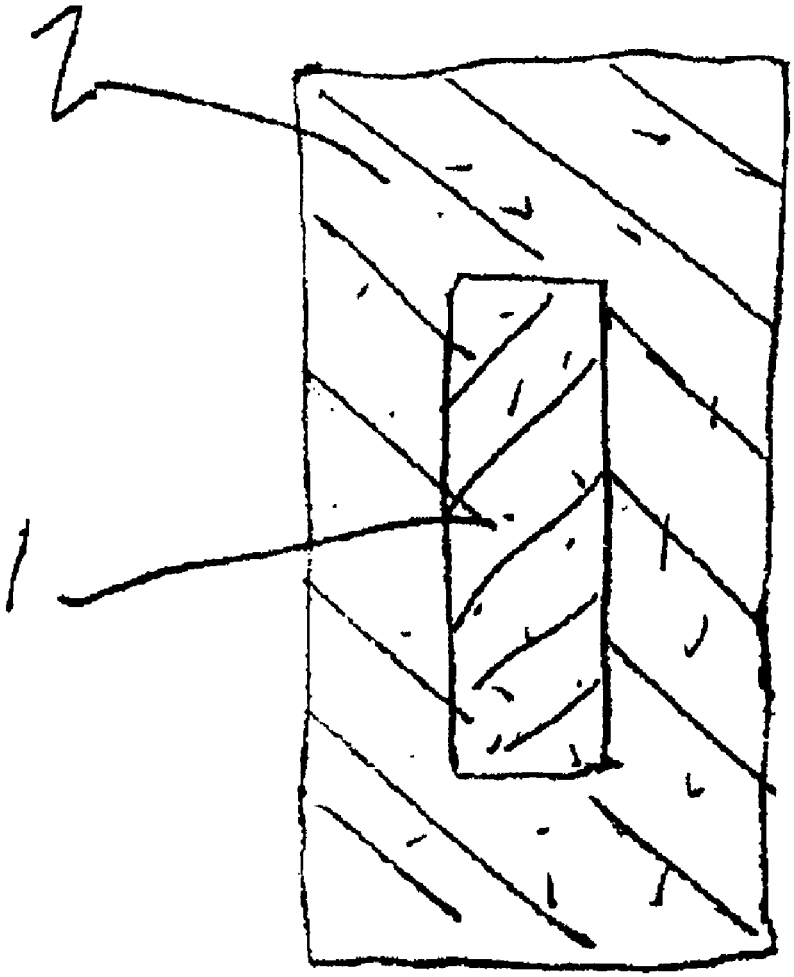
FIG. 1 is a cross sectional view of the inner portion of a high pressure cell used to treat CVD diamond according to the present invention.

The present invention is a process to heat treat single crystal CVD diamond at high temperature and high pressure. It is not certain what happens to the CVD material when it is subjected to such conditions. Possibly, internal atoms shift position to more correctly align themselves to the diamond crystalline structure or perhaps the bonding mechanism shifts such that $SP^2$ type bonds become $SP^3$ type bonds causing carbon atoms to change from impurity status to becoming part of the diamond crystal lattice.

Whatever the mechanism, it has been found that treating CVD diamond at high pressure and high temperature (HPHT) causes the optical properties to change so much that opaque material become clear. This same mechanism also improves the thermal conductivity and the electrical resistance for the CVD diamond. This is very unexpected since prior work has shown just the opposite occurs when CVD diamond is annealed in a vacuum to 1600° C. (A. V. Khomich et al., Diam. Relat. Mater. 10 (2001), pp. 546–551), Heating CVD diamond in vacuum has caused diamond to darken at temperatures as low as 850° C. (S. Mitra, K. I. Gleason, Diam. Relat. Mater. 2 (1993) p. 126).

Thus, one would expect that when diamond is heated to temperatures above 850° C., at pressures where graphite is the stable phase, significant degradation of the sample would result. However, very unexpected behavior occurs in CVD diamond at high temperatures where the pressure is raised above atmospheric pressure but still remains within the graphite stable region. Under certain conditions of temperature and pressure, CVD diamond does not degrade; instead the opposite occurs: the sample is transformed into a more perfect diamond crystalline material FIG. 1 shows a cross section of the inner portion of an assembly that may be employed to treat CVD diamond 1 according to the present invention. The outer body 2 is cylindrical in shape and is designed to fit within a central cavity of an ultrahigh pressure and ultrahigh temperature cell, such as that described in U.S. Pat. Nos. 3,745,623 or 3,913,280.

The outer body 2 is composed of graphite or other material that will readily transmit pressure and remain stable and non-reactive to the CVD diamond 1 at high temperature and high pressure. Other materials for the outer body 2 include, but are not limited to, salt, MgO, or talc. The CVD diamond 1 is encapsulated in the outer body 2. The CVD sample 1 is a stand alone CVD diamond or a CVD coating on diamond or other materials. This assembly should be consolidated to greater than 90% of its theoretical density and made to fit snugly into a HPHT reaction cell, such as that used to manufacture PCD.

The entire cell is subjected to pressures in excess of 4.0 GPA and heated to temperature in excess of 1500° C. for a time of five minutes. Then the cell is allowed to cool enough so that the CVD diamond does not back-convert to graphite after the pressure is released.

After pressing, the sample 1 is removed from the graphite outer body by mechanical means, such as by tapping with a mallet. The sample can then be further heated in an oven to 725° C. for approximately ten minutes in order to obtain a clean and smooth outer diamond surface. This treatment removes any graphite that may have adhered to the sample. The surface can also be polished in a manner as traditionally used on natural diamond single crystals or polycrystalline diamond compacts.

EXAMPLE #1

A cubed-shaped CVD coated synthetic type Ib diamond, approximately one centimeter square, was encapsulated in a graphite cylinder. The CVD portion was a layer on one side of the cube-shaped natural diamond, approximately one millimeter thick and was opaque to optical transmission. The synthetic diamond substrate was light yellow.

The graphite cylinder was loaded into a HPHT reaction vessel that was configured for indirect heating of the reaction mass. Various reaction vessel configurations, which provide the indirect or direct heating, are disclosed in the patent literature and are also useful for carrying out the present HPHT process.

Reaction vessels of this type usually of a plurality of interfitting cylindrical members and end plugs or discs for containing a sample in the innermost cylinder. For the indirectly heated type of reaction vessel, one of the cylindrical members is made of graphite that is heated by the passage of electric current through the cylinder. For this case, the reaction mass, if composed of graphite, must be electrically insulated from the graphite heater tube by an insulating material, such as talc or salt, to prevent passage of electrical current through the reaction mass. In the directly heated type of reaction vessel, the insulating sleeve is not required as the sample is heated by simply passing electric current through the reaction mass provided it is composed of an electrically conducting material, such as used in this example.

The reaction vessel was placed in a conventional HPHT apparatus. First, the pressure was increased to 5.0 GPA, and then the temperature was rapidly brought up to 2200° C. The sample was maintained at these conditions for five minutes, then the temperature was decreased over a period of about one minute to room temperature before the pressure was released.

The sample was removed from the reaction mass and examined under an optical microscope. The opaque CVD diamond layer turned clear and remained firmly bonded to the yellow synthetic type Ib diamond.

What is claimed is:

1. A method to improve the optical clarity of CVD diamond where the CVD diamond is single crystal CVD diamond, by raising the CVD diamond to a set temperature of at least 1500° C. and a pressure of at least 4.0 GPA outside of the diamond stable phase.

2. The method of claim 1 wherein the CVD diamond is a single crystal coating upon another material.

3. The method of claim 1 wherein the step of raising the temperature of the single crystal CVD diamond further comprises the step of:

raising the single crystal CVD diamond to a set temperature of about 1800° C. to about 2900° C.

4. The method of claim 1 wherein the step of raising the temperature of the single crystal CVD diamond further comprises the step of:

maintaining the temperature of the single crystal CVD diamond at the set temperature for less than about one minute.

5. The method of claim 1 wherein the step of raising the temperature of the single crystal CVD diamond further comprises the step of:

raising the temperature of the single crystal CVD diamond to at least 1500° C. over a time period of about one minute to five minutes.

6. The method of claim 1 wherein the step of raising the temperature of the single crystal CVD diamond comprises of the step of:

raising the temperature of the single crystal CVD diamond to about 2200° C. at a pressure of about 5.0 GPA.

7. The method of claim 1 further comprising the step of:

after reaching the set temperature, decreasing the temperature of the CVD diamond to ambient temperature while maintaining the pressure on the single crystal CVD diamond.

* * * * *